United States Patent
Matsuda et al.

(10) Patent No.: US 8,960,124 B2
(45) Date of Patent: Feb. 24, 2015

(54) PLASMA PROCESSING APPARATUS AND PLASMA PROCESSING METHOD

(75) Inventors: Ryuichi Matsuda, Takasago (JP); Kazuto Yoshida, Kobe (JP); Yuichi Kawano, Takasago (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 287 days.

(21) Appl. No.: 13/322,192

(22) PCT Filed: May 24, 2010

(86) PCT No.: PCT/JP2010/058734
§ 371 (c)(1),
(2), (4) Date: Jan. 27, 2012

(87) PCT Pub. No.: WO2010/143525
PCT Pub. Date: Dec. 16, 2010

(65) Prior Publication Data
US 2012/0125891 A1 May 24, 2012

(30) Foreign Application Priority Data

Jun. 11, 2009 (JP) ................................ 2009-139795

(51) Int. Cl.
*C23C 16/00* (2006.01)
*H01L 21/00* (2006.01)
(Continued)

(52) U.S. Cl.
CPC ..... *H01J 37/32577* (2013.01); *H01J 37/32467* (2013.01); *H01J 37/32504* (2013.01); *C23C 16/4404* (2013.01); *C23C 16/50* (2013.01); *Y10S 156/916* (2013.01)
USPC ...................................... 118/723 R; 156/916

(58) Field of Classification Search
CPC ..................... H01J 37/32495; H01J 37/32559; H01J 37/32651
USPC ........................................ 156/916; 118/723 R
See application file for complete search history.

(56) References Cited

U.S. PATENT DOCUMENTS 5,641,375 A 6/1997 Nitescu et al.
6,056,823 A * 5/2000 Sajoto et al. .................. 118/715
(Continued)

FOREIGN PATENT DOCUMENTS

EP 1699077 A1 * 9/2006
JP 2-183533 A 7/1990
(Continued)

OTHER PUBLICATIONS

Notice of Decision to Grant a Patent dated Jun. 2, 2014, issued in Corresponding Korean Patent Application No. 10-2011-7029464, with English Translation (4 pages).
(Continued)

*Primary Examiner* — Sylvia R MacArthur
*Assistant Examiner* — Anna Crowell
(74) *Attorney, Agent, or Firm* — Westerman, Hattori, Daniels & Adrian, LLP

(57) ABSTRACT

Provided are a plasma processing apparatus and a plasma processing method wherein particles generated due to the inner potential of an inner cylinder disposed inside of a vacuum container are reduced. The plasma processing apparatus has, inside of a metal vacuum chamber (11), the inner cylinder (15) composed of a surface-alumited aluminum, disposes a substrate in a plasma diffusion region, and performs plasma processing. A plurality of protruding portions (15a) in point-contact with the vacuum chamber (11) are provided on the lower end portion of the inner cylinder (15), the alumite film (16) on the leading end portion (15b) of each of the protruding portion (15a) is removed, and the inner cylinder and the vacuum chamber (11) are electrically connected to each other.

1 Claim, 4 Drawing Sheets

(51) Int. Cl.
*H01J 37/32* (2006.01)
*C23C 16/44* (2006.01)
*C23C 16/50* (2006.01)

(56) References Cited

U.S. PATENT DOCUMENTS

| | | | |
|---|---|---|---|
| 6,221,782 B1* | 4/2001 | Shan et al. | 438/710 |
| 6,277,237 B1* | 8/2001 | Schoepp et al. | 156/345.1 |
| 6,779,481 B2* | 8/2004 | Kent et al. | 118/723 R |
| 2004/0060657 A1* | 4/2004 | Saigusa et al. | 156/345.1 |
| 2007/0107843 A1* | 5/2007 | Kawano et al. | 156/345.24 |
| 2007/0215278 A1* | 9/2007 | Furuse et al. | 156/345.1 |

FOREIGN PATENT DOCUMENTS

| | | |
|---|---|---|
| JP | 8-172080 A | 7/1996 |
| JP | 09-172080 A | 6/1997 |
| JP | 10-038300 A | 2/1998 |
| JP | 10-70109 A | 3/1998 |
| JP | 10-321559 A | 12/1998 |
| JP | 11-312646 A | 11/1999 |
| JP | 2000-173931 A | 6/2000 |
| JP | 2004-165460 A | 6/2004 |
| JP | 2005-191023 A | 7/2005 |
| KR | 10-0774781 B1 | 11/2007 |
| TW | I288186 B | 10/2007 |

OTHER PUBLICATIONS

Korean Office Action dated Jun. 5, 2013, issued in corresponding Korean Patent Application No. 10-2011-7029464, w/ English translation.
Taiwanese Office Action dated May 22, 2013, issued in corresponding Taiwanese Patent Application No. 099117028, w/ English translation.
Japanese Office Action dated Jul. 15, 2014, issued in related Japanese Patent Application No. 2013-143134 with English translation (4 pages).
International Search Report of PCT/JP2010/058734, mailing date Jul. 20, 2010.
Written Opinion of PCT/JP2010/058734, mailing date Jul. 20, 2010.

* cited by examiner

PLASMA PROCESSING APPARATUS AND PLASMA PROCESSING METHOD

TECHNICAL FIELD

The present invention relates to a plasma processing apparatus including an inner tube in a vacuum chamber, the inner tube preventing products from adhering to an inner wall of the vacuum chamber, and to a plasma processing method.

BACKGROUND ART

A plasma processing apparatus including an inner tube in a vacuum chamber is known as a conventional art, the inner tube preventing products from adhering to an inner wall surface of the vacuum chamber (Patent Document 1). The inner tube is generally formed in conformity with an internal shape of the vacuum chamber. For example, if the vacuum chamber has a cylindrical shape, the inner tube is also formed in a cylindrical shape. Moreover, the inner tube is replaceably installed in the vacuum chamber. Thus, in maintenance, the inner cylinder itself may be replaced, and thereby, the maintenance can be done easily. The material of the inner tube is generally ceramic, but instead may be aluminum having an anodized surface.
Patent Document 1: Japanese Patent Application Publication No. 2005-191023

DISCLOSURE OF THE INVENTION

Problems to be Solved by the Invention

The inventors of the invention of the present application have found out, based on their finding, that the following problems occur in a plasma processing apparatus having an inner tube made of aluminum having an anodized surface, when plasma processing is performed with a substrate disposed in a plasma diffusion region to suppress a damage caused by plasma. These problems will be described with reference to Parts (a) to (c) of FIG. 1. Note that, Part (a) of FIG. 1 is a cross-sectional view of a plasma CVD apparatus having an inner tube, Part (b) of FIG. 1 is a graph showing profiles of a plasma potential along a line A and a line B of Part (a) of FIG. 1, and Part (c) of FIG. 1 is a graph showing a profile of the plasma potential along a line C of Part (a) of FIG. 1 and a profile of a potential along a line D of Part (a) of FIG. 1.

The configuration of a plasma CVD apparatus 10 shown in Part (a) of FIG. 1 will be briefly described first.

The plasma CVD apparatus 10 includes a cylindrical vacuum chamber 11 which is made of aluminum, a disc-shaped ceiling plate 12 which closes an upper opening of the vacuum chamber 11 and which is made of ceramic, a placing table 13 which is provided inside the vacuum chamber 11 and which supports a substrate 14 made of a semiconductor and the like, and a cylindrical inner tube 15 which is installed on a step portion 11a provided in an inner wall of the vacuum chamber 11 and which is made of aluminum having an anodized surface. The inner tube 15 is supported at protruding portions 15a which are in point-contact with the step portion 11a to maintain a thermally-stable state of the inner tube 15 itself.

Moreover, a turbo molecular pump 19 is connected to a lower portion of the vacuum chamber 11 through a gate valve 18 used for pressure control, and the pressure inside the vacuum chamber 11 can be control by the gate valve 18, the turbo molecular pump 19, and the like. Note that, although the plasma CVD apparatus 10 includes a plasma generation mechanism and a gas supplying mechanism in an upper portion of the ceiling plate 12 and in a side portion of the vacuum chamber 11, respectively, illustrations of these mechanisms are omitted in the drawing. Moreover, the placing table 13 has a cylindrical shape and has a structure in which a lower portion thereof is supported on a side wall of the vacuum chamber 11. However, an illustration of this is also omitted in the drawing.

To suppress plasma damage in the plasma CVD apparatus 10 with the above described configuration, the substrate 14 should be away from a plasma generation region P in which a plasma density is high, and disposed in a plasma diffusion region in which the electron density is decreased from that of the plasma generation region P due to the diffusion of electrons. In such case, profiles of the plasma potential in a radial direction of the vacuum chamber 11 appear as the graphs of Part (b) of FIG. 1. The line A of Part (a) of FIG. 1 is a straight line extending in the radial direction of the vacuum chamber 11 in the plasma generation region P at a position close to the plasma generation mechanism (a plasma antenna or the like which emits a high frequency electromagnetic wave, for example), and the plasma potential along the line A has a profile as shown in a graph A of Part (b) of FIG. 1. Moreover, the line B of Part (a) of FIG. 1 is a straight line extending in the radial direction of the vacuum chamber 11 in the plasma generation region P at a position close to the substrate 14, and the plasma potential along the line B has a profile as shown in a graph B of Part (b) of FIG. 1. Moreover, the plasma potential along a line extending in a direction of a center axis of the vacuum chamber 11, i.e. the line C, has a profile as shown in a graph C of Part (c) of FIG. 1.

As can be seen from the graphs A, B of Part (b) of FIG. 1, the potential of plasma is almost constant in the plasma generation region P, and is zero at the inner wall of the vacuum chamber 11 since the vacuum chamber 11 is grounded. Moreover, as can be seen from the graph C of Part (c) of FIG. 1, the potential of plasma rises once as it gets farther from the ceiling plate 12, reaches its peak in the plasma generation region P at a position close to the plasma generation mechanism, and thereafter gradually drops. Thus, when the substrate 14 is disposed at a position sufficiently away from the ceiling plate 12, i.e. in the plasma diffusion region, the plasma processing can be performed in a low plasma potential (≈low electron temperature) state. Hence, the plasma damage can be suppressed.

Disposing the substrate 14 in the plasma diffusion region requires that the height (length) of the inner tube 15 should also be made larger in accordance with a position where the substrate 14 is to be disposed. However, since the surface of the inner tube 15 itself is anodized, aluminum inside the inner tube 15 is in an electrically floating state with respect to the vacuum chamber 11 and acquires a potential due to the generation of plasma. For example, a potential along a line D extending in a height direction of the inner tube 15 has a profile as shown in a graph D of Part (c) of FIG. 1. Here, a reverse region E where the potential is higher than that of the graph C is generated in a lower end portion of the inner tube 15. When the reverse region E is generated, electrons collide with the lower end portion of the inner tube 15 and cause abnormal temperature rise. In addition, if there is a locally protruding portion, abnormal electrical discharge occurs between the inner tube 15 and the plasma and between the inner tube 15 and the vacuum chamber 11.

The entire inner tube 15 needs to be maintained at a constant temperature to prevent products adhering to the inner tube 15 from peeling off. However, if abnormal temperature rise such as one described above occurs, products adhering to a portion with the abnormal temperature rise peel off and may become a cause of particles. Moreover, if abnormal electrical discharge occurs, an anodized portion in the surface of the inner tube 15 peels off and may also become a cause of particles.

In addition, in a case where the placing table 13 includes an electrostatic attraction mechanism and a bias application mechanism, the potential of the substrate 14 becomes negative by use of these mechanisms. As a result, cations are generated in the plasma generation region to compensate for increase of cations consumed by collision with the substrate 14, and the plasma potential shifts to positive. Hence, the potential difference in the reverse region E becomes larger. This causes the abnormal temperature rise and the abnormal electrical discharge to be more significant, and particles due to these abnormalities may also become more significant.

It is considered that such problems do not occur in a case where the inner tube 15 is not used, even if the substrate 14 is disposed in the plasma diffusion region. However, in such case, increasing the frequency of repeating film formation and plasma cleaning develops a portion where the cleaning is excessive and a portion where a film remains. This causes increase of particles. As a result, cleaning of an inner wall of the vacuum chamber 11 or replacement of the vacuum chamber 11 itself is required. Meanwhile, the inner tube 15 can be easily replaced and is low cost. Thus, it is desired to reduce particles caused by the internal potential of the inner tube 15 even when the inner tube 15 is used.

The present invention has been made in view of the problems described above, and an object thereof is to provide a plasma processing apparatus and a plasma processing method which reduce particles caused by an internal potential of an inner tube installed inside a vacuum chamber.

Means for Solving the Problems

A plasma processing apparatus according to a first invention for solving the above problems is a plasma processing apparatus which includes an inner tube made of aluminum having an anodized surface inside a metal vacuum chamber and in which plasma processing is performed with a substrate disposed in a plasma diffusion region, wherein part of anodized aluminum in a surface of the inner tube is removed, so that the inner tube is electrically conductive with the vacuum chamber.

A plasma processing apparatus according to a second invention for solving the above problems is the plasma processing apparatus according to the first invention, wherein the inner tube is supported on the vacuum chamber by being in point-contact therewith, and anodized aluminum of a portion of the inner tube in point-contact is removed, so that the inner tube is electrically conductive with the vacuum chamber.

A plasma processing apparatus according to a third invention for solving the above problems is the plasma processing apparatus according to the second invention, wherein a plurality of protruding portions in point-contact with the vacuum chamber are provided in a lower end portion of the inner tube, and anodized aluminum at a leading end of each of the protruding portions is removed, so that the inner tube is electrically conductive with the vacuum chamber.

A plasma processing apparatus according to a fourth invention for solving the above problems is the plasma processing apparatus according to the first invention, wherein in a case of including a gas nozzle which is made of aluminum having an anodized surface and which is provided in an inner side wall of the vacuum chamber and disposed to penetrate a through-hole provided in the inner tube, a protruding portion in point-contact with the gas nozzle is provided in the through-hole of the inner tube, and anodized aluminum at a leading end of the protruding portion is removed, and anodized aluminum in a surface of a portion of the gas nozzle in point-contact with the protruding portion of the inner tube and in a surface of a portion of the gas nozzle in contact with the vacuum chamber is removed, so that the inner tube is electrically conductive with the vacuum chamber.

A plasma processing method according to a fifth invention for solving the above problems comprises the steps of:

disposing an inner tube made of aluminum having an anodized surface inside a metal vacuum chamber;

removing part of anodized aluminum in a surface of the inner tube, so that the inner tube is electrically conductive with the vacuum chamber;

disposing a substrate at a position in a plasma diffusion region in the vacuum chamber; and performing plasma processing on the substrate.

Effects of the Invention

In the present invention, part of the anodized aluminum in the surface of the inner tube is removed, so that the inner tube is electrically conductive with the vacuum chamber, in the plasma processing apparatus and the plasma processing method in which the plasma processing is performed with the substrate disposed in the plasma diffusion region. Thus, the internal potential of the inner tube is zero, and particles due to the internal potential are reduced. As a result, the performance and reliability of the plasma processing performed in the plasma processing apparatus and the plasma processing method can be improved.

EXPLANATION OF THE REFERENCE NUMERALS

10 PLASMA PROCESSING APPARATUS
11 VACUUM CHAMBER
12 CEILING PLATE
13 PLACING TABLE
14 SUBSTRATE

15 INNER TUBE
16 ANODIZED ALUMINUM
17 THROUGH-HOLE
21 GAS NOZZLE

BEST MODES FOR CARRYING OUT THE
INVENTION

Examples of embodiments of a plasma processing apparatus and a plasma processing method of the present invention will be described with reference to FIGS. 2 to 4. Note that, the present invention assumes the plasma CVD apparatus shown in Part (a) of FIG. 1, and overlapping descriptions thereof are omitted. Moreover, although the plasma CVD apparatus is given as an example, the present invention is applicable not only to the plasma CVD apparatus but also to a plasma etching apparatus.

Embodiment 1

Figure 1A:
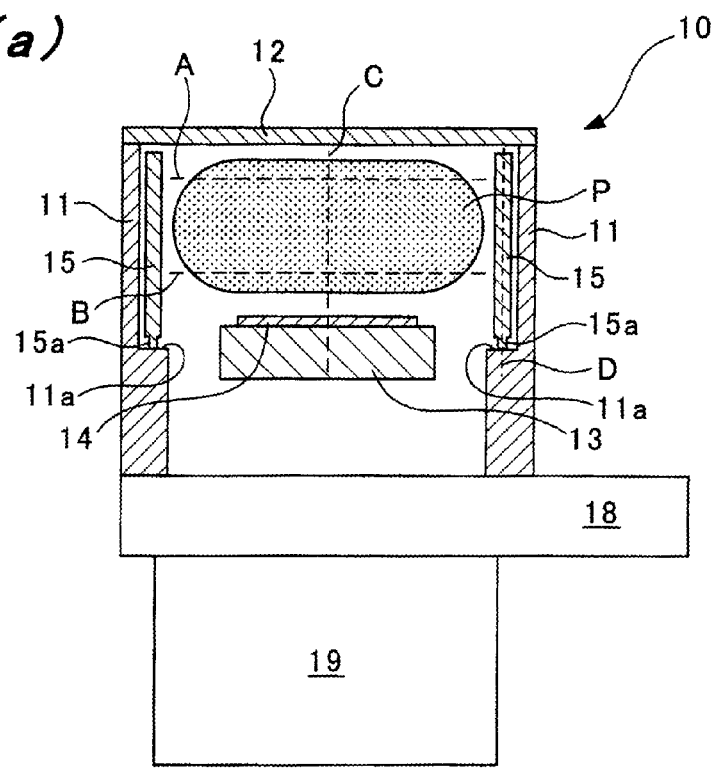
FIG. 1 Part (a) is a cross-sectional view of a plasma processing apparatus including an inner tube, Part (b) is a graph showing profiles of a plasma potential along a line A and a line B of Part (a), and Part (c) is a graph showing a profile of the plasma potential along a line C and a profile of a potential along a line D of Part (a).
Figure 1B:
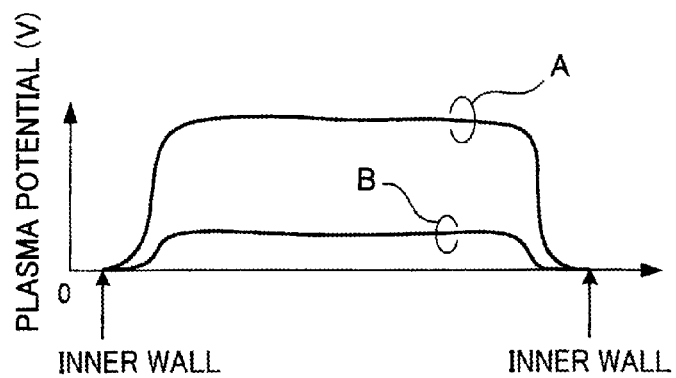
Figure 1C:
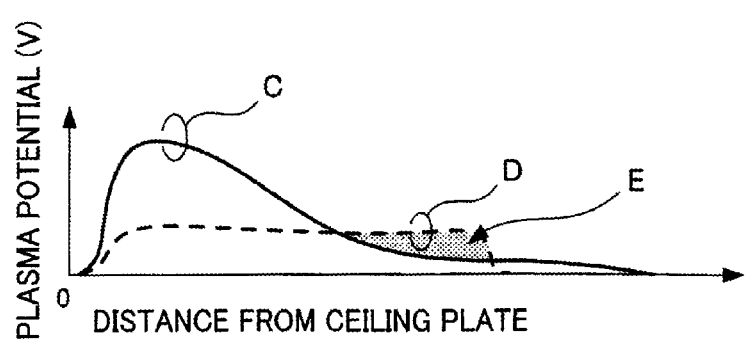
Figure 2:
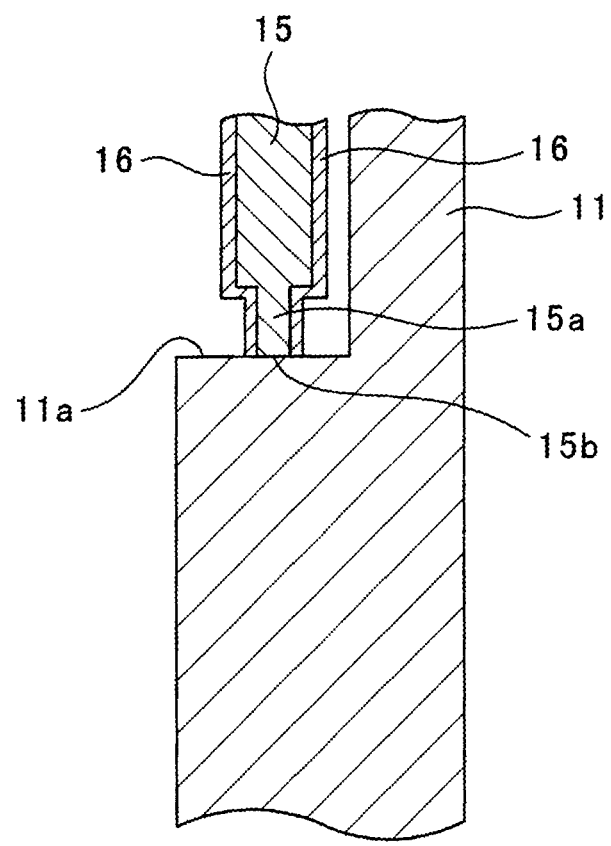
FIG. 2 shows an example of an embodiment (Embodiment 1) of the plasma processing apparatus of the present invention, and is a cross-sectional view showing a contact portion between the inner tube and a vacuum chamber.

This embodiment assumes the plasma CVD apparatus 10 shown in Part (a) of FIG. 1. In the plasma CVD apparatus 10, an inner tube 15 made of aluminum having an anodized surface is disposed in a metal vacuum chamber 11, a substrate 14 is disposed at a position in a plasma diffusion region in the vacuum chamber 11, and the substrate 14 is subjected to plasma processing. Note that, the inner tube 15 prevents products from adhering to an inner wall surface of the vacuum chamber 11, and also protects the inner wall surface of the vacuum chamber 11 from exposure to plasma.

In the embodiment, the inner tube 15 includes multiple (at least three) protruding portions 15a in a lower end portion thereof so that the inner tube 15 can be supported on a step portion 11a of the vacuum chamber 11 by being in point-contact therewith. An anodized aluminum coating 16 is formed on the entire surface of the inner tube 15 by anodizing. However, the anodized aluminum coating 16 of a leading end portion 15b, i.e. a point-contact portion, of each of the protruding portions 15a is removed to maintain electrical conduction with the vacuum chamber 11. Note that, the inner wall of the vacuum chamber 11 may also be anodized to form an anodized aluminum coating thereon. In such case, only the anodized aluminum coating of the step portion 11a is removed to maintain electrical conduction with the inner tube 15.

As described above, the anodized aluminum coating 16 of the leading end portion 15b of each protruding portion 15a of the inner tube 15 is removed, i.e. part of the anodized aluminum coating 16 is removed, and an inner aluminum portion is thus exposed. This causes the inner tube 15 to maintain the electrical conduction with the vacuum chamber 11 and to be thermally in point-contact with the vacuum chamber 11.

Moreover, since the vacuum chamber 11 is grounded and the inner tube 15 is electrically conductive with the vacuum chamber 11, the potential of the aluminum portion inside the inner tube 15 is zero. Thus, no reverse region E as shown in Part (c) of FIG. 1 is generated. Accordingly, no concentration of electric field occurs, no local collision of electrons occurs, and therefore no abnormal temperature rise and no abnormal electrical discharge occur. As a result, particles due to the internal potential are reduced.

Moreover, the entire inner tube 15 needs to be maintained at a constant temperature to prevent products adhering to the inner tube 15 from peeling off. Thus, as described above, the inner tube 15 is thermally in point-contact with the vacuum chamber 11. In addition, the inner tube 15 is installed inside the vacuum chamber 11 with a gap provided in between, the gap being large enough to prevent contact with the inner wall surface of the vacuum chamber 11, which is, for example, a gap of about 0.5 mm. When the inner tube 15 is installed as described above, heat input by the plasma and cooling by the vacuum chamber 11 cause the temperature of the inner tube 15 to be stable at an almost constant temperature.

Figure 3:
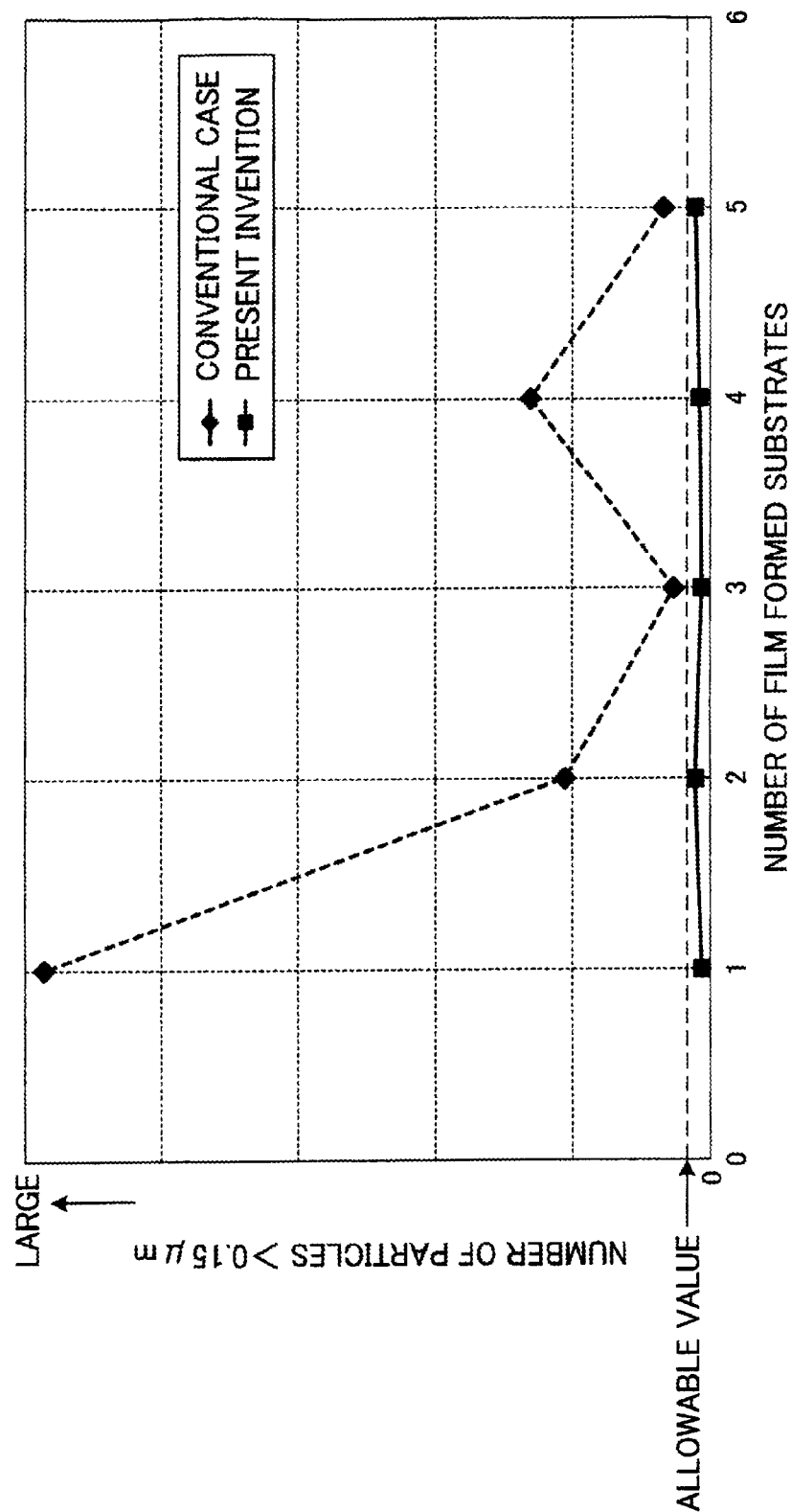
FIG. 3 is a graph comparing changes in the number of particles in a conventional plasma processing apparatus and changes in the number of particles in the plasma processing apparatus of Embodiment 1.
Figure 4:
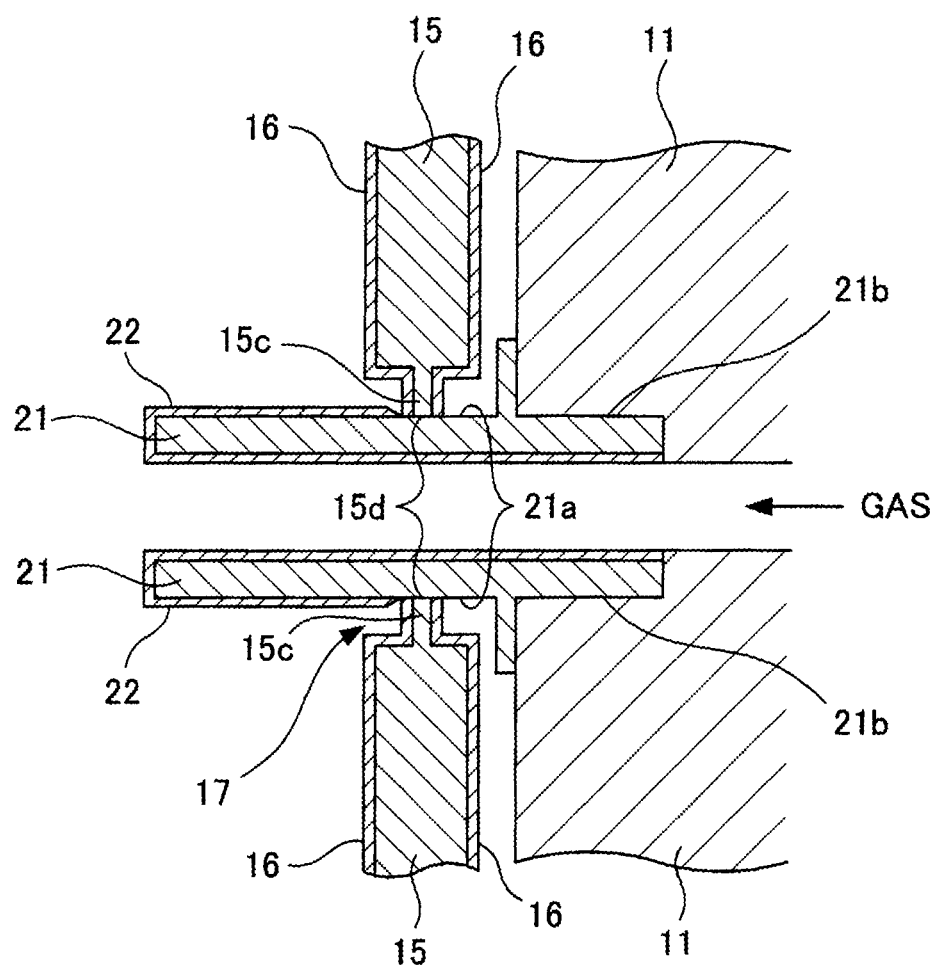
FIG. 4 shows another example of an embodiment (Embodiment 2) of the plasma processing apparatus of the present invention, and is a cross-sectional view showing a contact portion between the inner tube and a gas nozzle.

FIG. 3 shows a graph comparing changes in the number of particles after plasma cleaning in a conventional plasma CVD apparatus and changes in the number of particles after plasma cleaning in the plasma CVD apparatus of the embodiment. Note that, in the conventional plasma CVD apparatus, the entire surface of the inner tube 15 is anodized, so that the inner tube 15 has no electrically conductive portion at all. In the plasma CVD apparatus of the embodiment, although the entire surface of the inner tube 15 is anodized, electrically conductive portions are provided in some parts (only in the leading end portions 15b).

As can be seen from FIG. 3, in the conventional plasma CVD apparatus, when film formation is performed about five times after the plasma cleaning, the number of particles is reduced to a level smaller than that after the first film formation. However, the number of particles still exceeds an allowable value. On the other hand, in the plasma CVD apparatus of the embodiment, the number of particles is reduced to a level below the allowable value from the first film formation.

Embodiment 2

This embodiment also assumes the plasma CVD apparatus 10 shown in Part (a) of FIG. 1. In Embodiment 1, the electrically conductive portions are provided in the lower end portions (leading end portions 15b) of the inner tube 15. However, if there is no such structure as the step portion 11a, the following configuration may be employed. For example, gas nozzles 21 penetrating the inner tube 15 are provided in the inner side wall of the vacuum chamber 11, and the inner tube 15 is electrically conductive with the gas nozzles 21. Such configuration will be described with reference to FIG. 4.

In the embodiment, multiple gas nozzles 21 penetrating the inner tube 15 from the inner side wall of the vacuum chamber 11 are provided. The installed positions of the gas nozzles 21 may be any positions between the height position of the ceiling plate 12 and the height position of the substrate 14. However, positions near the ceiling plate 12 are desirable.

Each gas nozzle 21 has a cylindrical shape, and is made of aluminum having an anodized surface, as similar to the inner tube 15. However, in the gas nozzle 21, an anodized aluminum coating 22 is removed in a contact portion 21a to be in contact with the inner tube 15 and in a contact portion 21b to be in contact with the vacuum chamber 11. Meanwhile, through-holes 17 through which the respective gas nozzles 21 penetrate are provided in the inner tube 15. Multiple protruding portions 15c to be in point-contact with the gas nozzles 21 are formed in inner sides of the through-holes 17, and the anodized aluminum coating 16 is removed in a lead end portion 15d of each of the protruding portions 15c. Thus, electrical conduction between the inner tube 15 and the vacuum chamber 11 is maintained via the gas nozzles 21. Meanwhile, the protruding portions 15c are thermally in point-contact with the contact portions 21a.

Since the inner tube 15 is electrically conductive with the vacuum chamber 11 as in Embodiment 1, the potential of the aluminum portion inside the inner tube 15 is zero and no reverse region E as shown in Part (c) of FIG. 1 is generated. Accordingly, no concentration of electric field occurs, no local collision of electrons occurs, and therefore no abnormal temperature rise and no abnormal electrical discharge occur.

As a result, particles due to the internal potential are reduced.

Moreover, the inner tube 15 is thermally in point-contact with the vacuum chamber 11 as in Embodiment 1. In addition, the inner tube 15 is installed inside the vacuum chamber 11 with a gap provided in between, the gap being large enough to prevent contact with the inner wall surface of the vacuum chamber 11, which is, for example, a gap of about 0.5 mm. Installing the inner tube 15 as described above maintains the entire inner tube 15 at a constant temperature, so that adhering products are prevented from peeling off.

INDUSTRIAL APPLICABILITY

The present invention is preferably applied to a plasma processing apparatus such for example as a plasma CVD apparatus or a plasma etching apparatus which includes an inner tube made of aluminum having an anodized surface and which performs plasma processing with a substrate being disposed in a plasma diffusion region. Moreover, the present invention is preferably applied to a plasma processing method such as plasma CVD or plasma etching.

The invention claimed is:
1. A plasma processing apparatus, comprising:
an inner tube made of aluminum having an anodized surface, the inner tube is provided inside a metal vacuum chamber and in which plasma processing is performed with a substrate disposed in a plasma diffusion region;
a gas nozzle which is made of aluminum having an anodized surface and which is provided in an inner side wall of the vacuum chamber and disposed to penetrate a through-hole provided in the inner tube;
a protruding portion having a leading end is provided in the through-hole of the inner tube, the leading end of the protruding portion in point-contact with the gas nozzle is not provided with the anodized aluminum, and
a surface of a portion of the gas nozzle in point-contact with the protruding portion of the inner tube and in a surface of a portion of the gas nozzle in contact with the vacuum chamber is not provided with the anodized aluminum so that the inner tube is electrically conductive with the vacuum chamber.

* * * * *